(12) United States Patent
Takeshita et al.

(10) Patent No.: US 8,629,385 B2
(45) Date of Patent: Jan. 14, 2014

(54) SOLID-STATE IMAGING ELEMENT AND DRIVING METHOD OF THE SOLID-STATE IMAGING ELEMENT

(75) Inventors: Kaneyoshi Takeshita, Tokyo (JP); Takashi Kubodera, Kanagawa (JP); Akihiro Nakamura, Kumamoto (JP)

(73) Assignee: Sony Corporation (JP)

( * ) Notice: Subject to any disclaimer, the term of this patent is extended or adjusted under 35 U.S.C. 154(b) by 738 days.

(21) Appl. No.: 12/705,161

(22) Filed: Feb. 12, 2010

(65) Prior Publication Data

US 2010/0213354 A1    Aug. 26, 2010

(30) Foreign Application Priority Data

Feb. 23, 2009    (JP) .................................. 2009-039765

(51) Int. Cl.
*H01L 27/00*    (2006.01)
(52) U.S. Cl.
USPC ..................... 250/208.1; 250/214.1; 257/184; 257/187; 257/314; 257/315; 257/320; 348/272
(58) Field of Classification Search
USPC ............ 250/208.1, 226, 214.1; 257/292, 184, 257/187, 290, 314, 315, 320, 444; 348/273–274, 272
See application file for complete search history.

(56) References Cited

U.S. PATENT DOCUMENTS

| | | | | |
|---|---|---|---|---|
| 6,731,335 | B1* | 5/2004 | Kim et al. | ...................... 348/308 |
| 8,410,528 | B2* | 4/2013 | Min | ............................... 257/232 |
| 2004/0161868 | A1 | 8/2004 | Hong | |
| 2004/0178467 | A1 | 9/2004 | Lyon | |
| 2005/0205903 | A1* | 9/2005 | Hioki | ............................ 257/291 |
| 2006/0007333 | A1* | 1/2006 | Horii | .............................. 348/294 |
| 2006/0008937 | A1* | 1/2006 | Blanchard et al. | ............... 438/57 |
| 2006/0215048 | A1* | 9/2006 | Suzuki | ........................... 348/272 |
| 2007/0161140 | A1* | 7/2007 | Song et al. | ....................... 438/48 |
| 2008/0185619 | A1 | 8/2008 | Merrill | |
| 2008/0296475 | A1* | 12/2008 | Kim | ........................... 250/208.1 |

FOREIGN PATENT DOCUMENTS

| | | |
|---|---|---|
| EP | 2207204 | 7/2010 |
| JP | 10-284714 | 10/1998 |
| JP | 10284714 | 10/1998 |
| JP | 2006-278446 | 10/2006 |
| JP | 2007-165886 | 6/2007 |
| WO | WO2005119681 | 12/2005 |

OTHER PUBLICATIONS

Japanese Office Action issued on Aug. 23, 2011 in connection with counterpart JP Application No. 2009-039765.

(Continued)

*Primary Examiner* — Seung C Sohn
*Assistant Examiner* — Kevin Wyatt
(74) *Attorney, Agent, or Firm* — Sheridan Ross P.C.

(57) ABSTRACT

Disclosed herein is a solid-state imaging element including: (A) a light reception/charge storage region formed in a semiconductor layer, the light reception/charge storage region including M light reception/charge storage layers stacked one on top of the other, where $M \geq 2$; (B) a charge output region formed in the semiconductor layer; (C) a conduction/non-conduction control region which includes a portion of the semiconductor layer located between the light reception/charge storage region and the charge output region; and (D) a conduction/non-conduction control electrode adapted to control the conduction or non-conduction state of the conduction/non-conduction control region, wherein mth potential control electrodes are provided between the mth and (m+1)th light reception/charge storage layers, where $1 \leq m \leq (M-1)$, to control the potentials of the light reception/charge storage layers.

19 Claims, 13 Drawing Sheets

(56) References Cited

OTHER PUBLICATIONS

European Search Report corresponding to European Serial No. 10001328.3 dated Dec. 5, 2011.

European Search Report corresponding to European Serial No. 10001328.3 dated Jul. 1, 2010.

* cited by examiner 40  50  13

50  24

F I G . 7
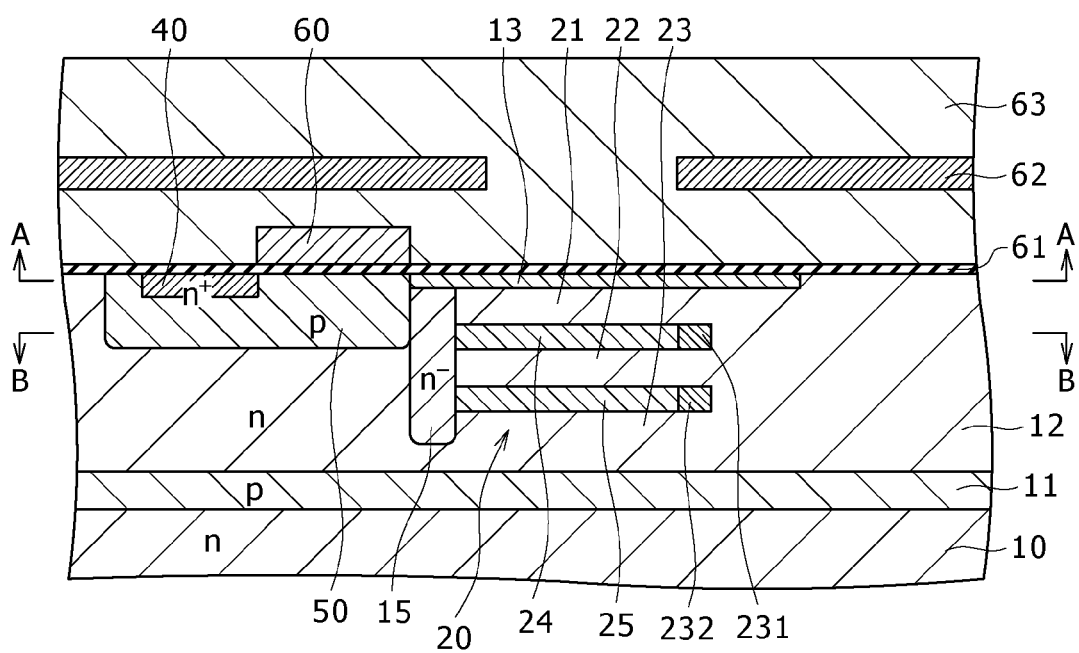

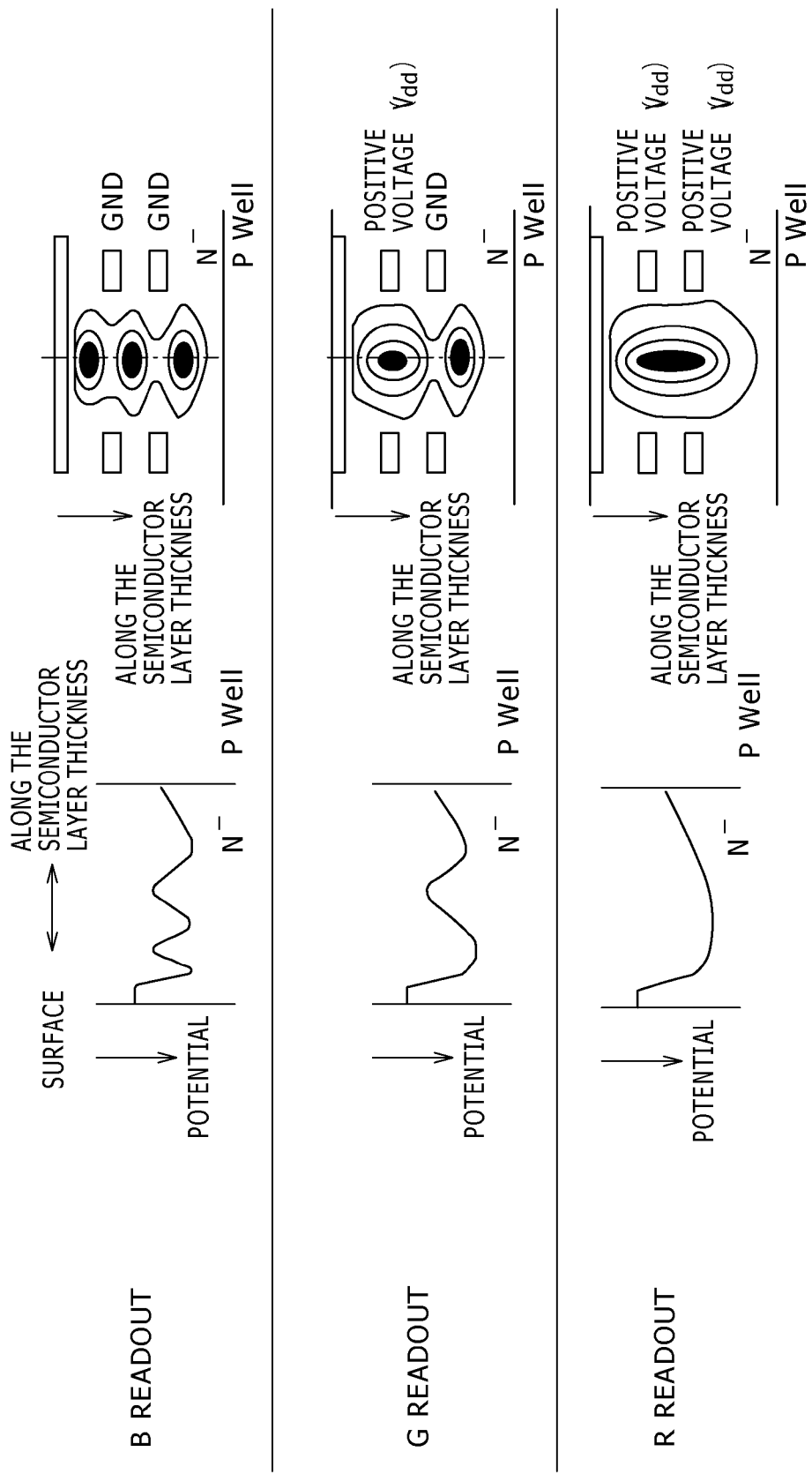

FIG.10A [STEP-A]
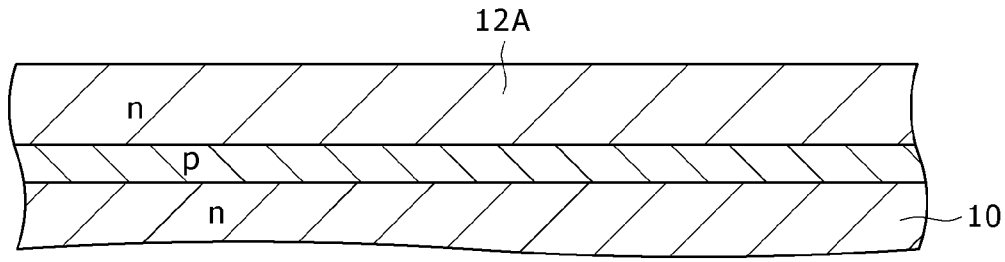
FIG.10B [STEP-A] (CONTINUED)
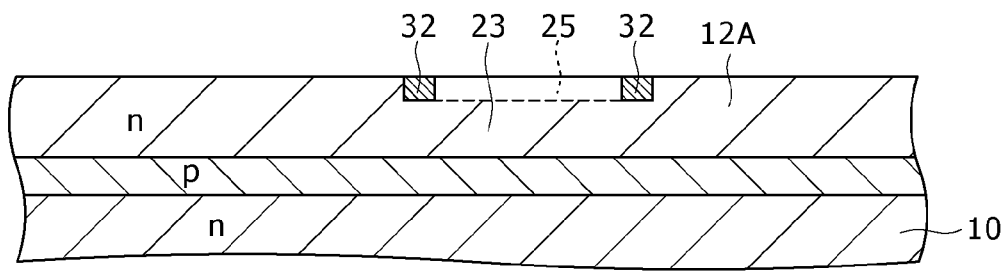
FIG.10C [STEP-B]
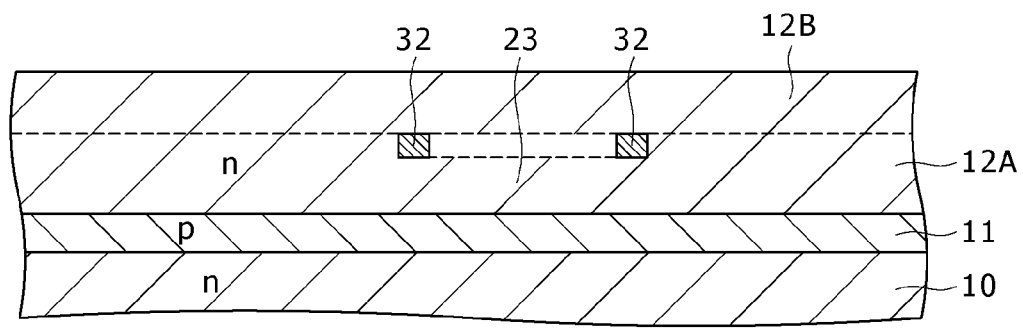
FIG.10D [STEP-B] (CONTINUED)
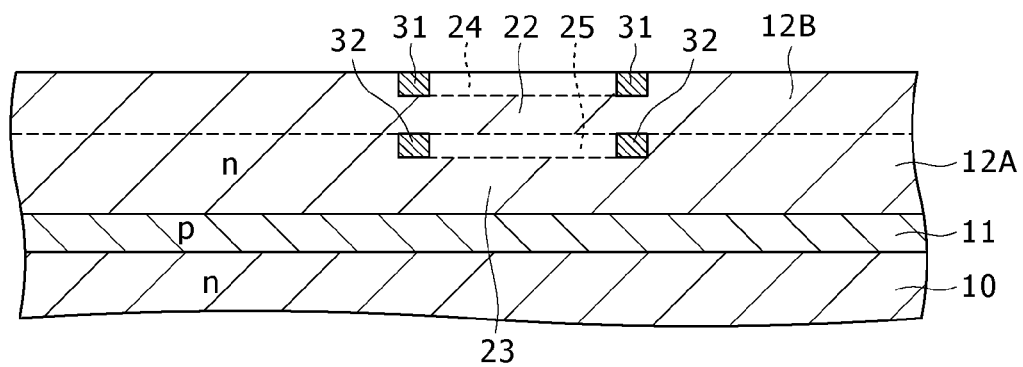

FIG.11A [STEP-C]
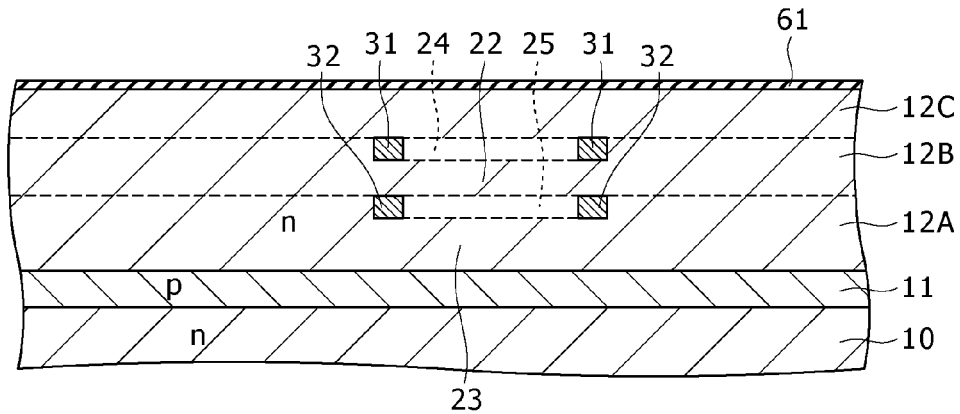
FIG.11B [STEP-C] (CONTINUED)
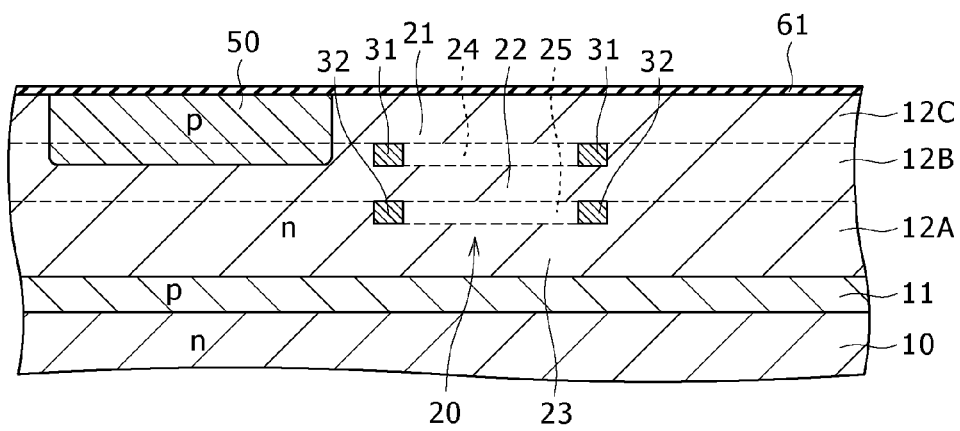

SOLID-STATE IMAGING ELEMENT AND DRIVING METHOD OF THE SOLID-STATE IMAGING ELEMENT

BACKGROUND OF THE INVENTION

1. Field of the Invention

The present invention relates to a solid-state imaging element and driving method of the same, and more specifically to a single plate solid-state imaging element and driving method of the same.

2. Description of the Related Art

In an existing single plate color solid-state imaging element such as CCD (charge coupled device) or CMOS (complementary metal oxide semiconductor) image sensor, a color filter is provided above a light reception/charge storage layer to pass red, green or blue light. In order to obtain color image information, visible light passing through the color filter and received by the light reception/charge storage layer is output from the solid-state imaging element as a signal. Incidentally, approximately ⅔ of the incident light is absorbed by the color filters of the respective colors, thus resulting in poor visible light utilization efficiency and low sensitivity. Moreover, each solid-state imaging element provides a color signal of a single color, resulting in poor resolution and conspicuous false color in particular.

In order to overcome these defects, solid-state imaging elements have been studied and developed which have three light reception/charge storage layers stacked one on top of the other (refer, for example, to Japanese Patent Laid-Open No. 2006-278446, hereinafter referred to as Patent Document 1). In a solid-state imaging element having such a structure, for example, three light reception/charge storage layers adapted, respectively, to generate charge in response to light of three primary colors or blue, green and red light are stacked in this order from the light incident surface. Each of the solid-state imaging elements has a signal readout circuit adapted to independently read out the charge generated by each light reception/charge storage layer and converts almost all incident light into an electric signal. This ensures nearly 100% visible light utilization efficiency. A single solid-state imaging element provides signals of the three primary colors of red, green and blue, thus providing excellent image with high sensitivity and high resolution.

SUMMARY OF THE INVENTION

In the solid-state imaging element disclosed in Patent Document 1, however, a MOS (metal oxide semiconductor) switch is provided for each of the light reception/charge storage layers stacked one on top of the other. That is, three MOS switches are provided independently of each other. This results in a large area of the solid-state imaging element as a whole, making the element unfit for miniaturization.

In light of the foregoing, it is desirable to provide a solid-state imaging element, having light reception/charge storage layers stacked one on top of the other, whose area as a whole can be reduced, and a driving method of the same.

The solid-state imaging element according to an embodiment of the present invention includes the following:
(A) a light reception/charge storage region formed in a semiconductor layer and which includes M light reception/charge storage layers stacked one on top of the other (where M≥2);
(B) a charge output region formed in the semiconductor layer;
(C) a conduction/non-conduction control region which includes a portion of the semiconductor layer located between the light reception/charge storage region and the charge output region; and
(D) a conduction/non-conduction control electrode adapted to control the conduction or non-conduction state of the conduction/non-conduction control region.

Further, mth potential control electrodes are provided between the mth and (m+1)th light reception/charge storage layers [where 1≤m≤(M−1)] to control the potentials of the light reception/charge storage layers.

The driving method of a solid-state imaging element according to an embodiment of the present invention is a driving method of the above solid-state imaging element. The driving method applies a predetermined voltage to the conduction/non-conduction control electrode to bring the conduction/non-conduction control region into conduction. The driving method also applies a first control voltage to the first to (m−1)th potential control electrodes and a second control voltage to the mth to (M−1)th potential control electrodes at the same time. This potentially isolates the first to mth light reception/charge storage layers from the (m+1)th to Mth light reception/charge storage layers, thus transferring the charge stored in the first to mth light reception/charge storage layers to the charge output region via the conduction/non-conduction control region which has been brought into conduction.

It should be noted that when m=1, that is, when the charge stored in the first light reception/charge storage layer is transferred to the charge output region, the driving method applies a predetermined voltage to the conduction/non-conduction control electrode to bring the conduction/non-conduction control region into conduction. The driving method also applies the second control voltage to the first to (M−1)th potential control electrodes. This potentially isolates the first light reception/charge storage layer from the second to Mth light reception/charge storage layers, thus transferring the charge stored in the first light reception/charge storage layer to the charge output region via the conduction/non-conduction control region which has been brought into conduction. On the other hand, when the charge stored in the Mth light reception/charge storage layer is transferred to the charge output region, the driving method applies a predetermined voltage to the conduction/non-conduction control electrode to bring the conduction/non-conduction control region into conduction. The driving method also applies the first control voltage to the first to (M−1)th potential control electrodes. This transfers the charge stored in the first to Mth light reception/charge storage layers to the charge output region via the conduction/non-conduction control region which has been brought into conduction.

In the solid-state imaging element or driving method of the same, the mth potential control electrode is provided between the mth and (m+1)th light reception/charge storage layers [where 1≤m≤(M−1)] to control the potentials of the light reception/charge storage layers. This transfers the charge stored in the light reception/charge storage layers to the charge output region via the conduction/non-conduction control region which has been brought into conduction if the appropriate first and second control voltages are applied to the potential control electrodes, thus downsizing the solid-state imaging element as a whole. A solid-state imaging element having potential control electrodes in the semiconductor layer and adapted to control the potential control electrodes so as to control the transfer of the charge stored in the light reception/charge storage layers to the charge output region is unknown as far as the investigation conducted by the inventor is concerned.

BRIEF DESCRIPTION OF THE DRAWINGS

FIG. 7 is a schematic partial sectional view of the solid-state imaging element according to embodiment 4;

FIG. 9 is a diagram illustrating the potential of each region for describing a driving method of the solid-state imaging element according to embodiment 1;

FIGS. 10A to 10D are schematic partial sectional views of a silicon semiconductor substrate and other components for describing the manufacturing method of the solid-state imaging element according to embodiment 1;

FIGS. 11A and 11B are schematic partial sectional views, continued from FIGS. 10A to 10D, of a silicon semiconductor substrate and other components for describing the manufacturing method of the solid-state imaging element according to embodiment 1;

DETAILED DESCRIPTION OF THE PREFERRED EMBODIMENTS

Figure 1:
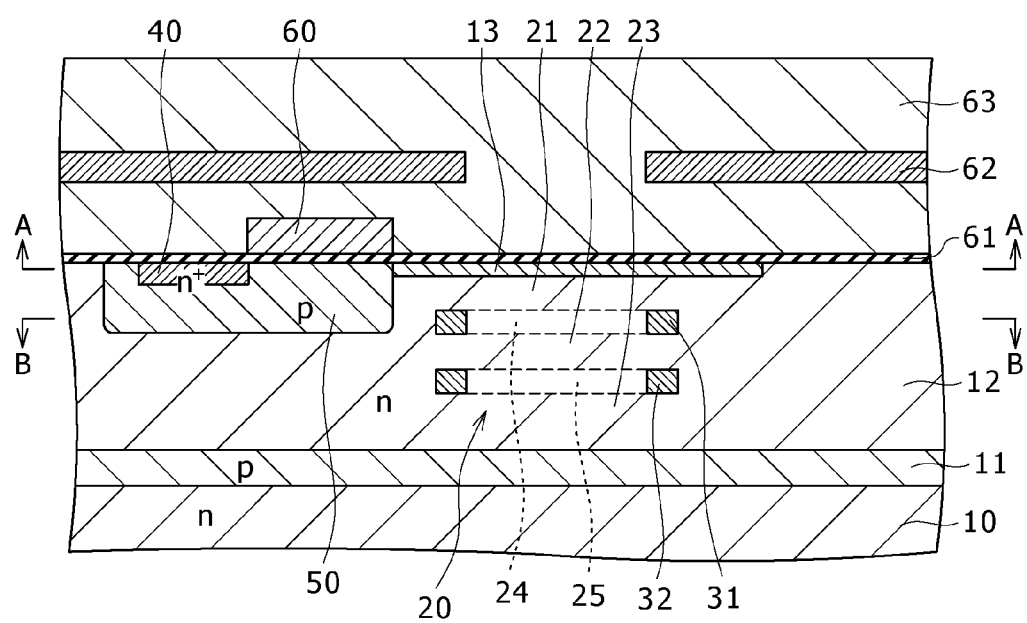
FIG. 1 is a is a schematic partial sectional view of a solid-state imaging element according to embodiment 1.

The present invention will be described below based on embodiments with reference to the accompanying drawings. However, the present invention is not limited to these embodiments, and the values and materials described in the embodiments are merely illustrative. It should be noted that the description will be given in the following order:

1. Description relating in general to the solid-state imaging element and driving method of the same according to an embodiment of the present invention
2. Embodiment 1 (specific description of the solid-state imaging element and driving method of the same)
3. Embodiment 2 (modification example of embodiment 1)
4. Embodiment 3 (another modification example of embodiment 1)
5. Embodiment 4 (still another modification example of embodiment 1 and others)

[Description Relating in General to the Solid-State Imaging Element and Driving Method of the Same According to an Embodiment of the Present Invention]

In the solid-state imaging element according to an embodiment of the present invention, a first control voltage is applied to the first to (m−1)th potential control electrodes, and a second control voltage to the mth to (M−1)th potential control electrodes at the same time. This potentially isolates the first to mth light reception/charge storage layers from the (m+1)th to Mth light reception/charge storage layers.

In the solid-state imaging element according to an embodiment of the present invention including the above preferred embodiment or the solid-state imaging element driven by the driving method of a solid-state imaging element according to an embodiment of the present invention, the potential control electrodes and conduction/non-conduction control region may have a first conductivity type, and the charge output region, light reception/charge storage layers and intermediate layers sandwiched between the mth and (m+1)th light reception/charge storage layers may have a second conductivity type. In this case, the intermediate layers may be at least partially surrounded by the potential control electrodes. Here, if the first conductivity type is p type, the second conductivity type is n type. Electrons serve as carriers. On the other hand, if the first conductivity type is n type, the second conductivity type is p type. Holes serve as carriers. Further, if, for example, the first conductivity type is p type, and the second conductivity type n type, it is preferred that the charge output region should be an $n^+$ type impurity region, that the light reception/charge storage layers and intermediate layers should be n type impurity regions, and that the potential control electrodes and conduction/non-conduction control region should be p type impurity regions.

In the solid-state imaging element according to an embodiment of the present invention including the above preferred embodiment and configuration or the solid-state imaging element driven by the driving method of a solid-state imaging element according to an embodiment of the present invention, the uppermost light reception/charge storage layer may be covered with a coating layer. The coating layer includes a semiconductor material containing an impurity different in conductivity type from the same light reception/charge storage layer. The coating layer may be connected to the conduction/non-conduction control region. For example, if the light reception/charge storage layer is an n type impurity region, it is preferred that the coating layer should be a $p^+$ type impurity region. If covered with the coating layer, the uppermost light reception/charge storage layer contributes to reduced dark current and reduced kTC noise. It should be noted that an interlayer insulating layer transparent to incident light may be formed on the uppermost light reception/charge storage layer, and transparent electrodes on the same interlayer insulating layer rather than providing the coating layer to provide reduced dark current and reduced kTC noise.

Further, in the solid-state imaging element according to an embodiment of the present invention including the various preferred embodiments and configurations described above or the solid-state imaging element driven by the driving method of a solid-state imaging element according to an embodiment of the present invention, a potential barrier region may be formed in the region of the semiconductor layer between the light reception/charge storage layers and the conduction/non-conduction control region. The potential barrier region contains an impurity of the same conductivity type as for the light reception/charge storage layers. In such a configuration, the potential control electrodes and conduction/non-conduction control region may have a first conductivity type, and the charge output region, light reception/charge storage layers and intermediate layers sandwiched between the mth and (m+1)th light reception/charge storage layers may have a second conductivity type. The intermediate layers may be at least partially surrounded by the potential control electrodes.

Alternatively, in such a configuration (except that in which intermediate layers are formed), the potential control electrodes and conduction/non-conduction control region may have a first conductivity type, and the charge output region and light reception/charge storage layers may have a second conductivity type. The potential control electrodes may be sandwiched between the mth and (m+1)th light reception/charge storage layers. It should be noted that if the light reception/charge storage layers are n type impurity regions, it is preferred that the potential barrier region should be an n⁻ type impurity region. Forming such a potential barrier region allows the charge stored in the light reception/charge storage layers to be transferred to the charge output region via the conduction/non-conduction control region.

Still further, in the solid-state imaging element according to an embodiment of the present invention including the various preferred embodiments and configurations described above or the solid-state imaging element driven by the driving method of a solid-state imaging element according to an embodiment of the present invention, an element isolation layer may be formed on the surface of the semiconductor layer. The element isolation layer includes a semiconductor material containing an impurity different in conductivity type from the light reception/charge storage layers. It should be noted that if the light reception/charge storage layers are n type impurity regions, it is preferred that the element isolation layer should be a $p^+$ type impurity region.

Still further, in the solid-state imaging element according to an embodiment of the present invention including the various preferred embodiments and configurations described above or the solid-state imaging element driven by the driving method of a solid-state imaging element according to an embodiment of the present invention, it is preferred that the light reception/charge storage layers should be completely depleted or brought into complete depletion before the charge is stored. This suppresses kTC noise. It should be noted that the light reception/charge storage layers may not be completely depleted under certain circumstances. Also in the previous operation, the charge stored in the light reception/charge storage layers is transferred to the charge output region. The light reception/charge storage layers may be completely depleted at the completion of this operation. Therefore, such an operation is included in the concept that "the light reception/charge storage layers are completely depleted before the charge is stored." In the driving method of a solid-state imaging element according to an embodiment of the present invention, the light reception/charge storage layers may be completely depleted before the charge is stored. Here, the expression "before the charge is stored" is used to convey the same meaning.

In the solid-state imaging element according to an embodiment of the present invention including the various preferred embodiments and configurations described above and the driving method of a solid-state imaging element according to an embodiment of the present invention including the various preferred embodiments and configurations described above (all of which may be hereinafter collectively referred to as simply the "present invention"), it is preferred that charge should be electrons and that, when the charge stored in the light reception/charge storage layers is transferred to the charge output region, the charge output region should be lower in potential than the light reception/charge storage layers. Further, it is preferred that the conduction/non-conduction control region should be higher in potential than the charge output region and lower in potential than the light reception/charge storage layers. Still further, it is preferred that the intermediate layers formed by the application of the second control voltage to the potential control electrode should be higher in potential than the light reception/charge storage layers.

Further, among specific configurations and structures of the conduction/non-conduction control electrode in the present invention is a kind of MOS switch or junction FET (field effect transistor) structure. The MOS switch includes a transfer gate formed above the conduction/non-conduction control region via an insulting film. The junction FET structure is made up of the conduction/non-conduction control region sandwiched between two electrodes, one on top and another on the bottom. On the other hand, the potential control electrodes may include an electrode structure rather than a semiconductor layer region containing a high-concentration impurity as described above. The electrode structure is made of a metal, alloy, conductive oxide or nitride, polysilicon or other material which is electrically insulated by an insulating layer. The semiconductor layer may include, for example, a silicon layer formed by epitaxial growth on a silicon semiconductor substrate of a desired conductivity type. Under certain circumstances, the semiconductor layer may include the surface region of a silicon semiconductor substrate.

"2" and "3" are among specific values which M takes on although M is not limited thereto. When M=3, the light reception/charge storage layer closest to the light incident surface of the semiconductor layer (referred to as the first light reception/charge storage layer (m=1) for reasons of convenience) is located, for example, on the average, 0.1 μm to 0.3 μm from the light incident surface of the semiconductor layer. The light reception/charge storage layer second closest to the light incident surface of the semiconductor layer (referred to as the second light reception/charge storage layer (m=2) for reasons of convenience) is located, for example, on the average, 0.5 μm to 0.8 μm from the light incident surface of the semiconductor layer. The light reception/charge storage layer farthest from the light incident surface of the semiconductor layer (referred to as the third light reception/charge storage layer (m=M=3) for reasons of convenience) is located, for example, on the average, 1.5 μm to 3 μm from the light incident surface of the semiconductor layer. In such a configuration, the first light reception/charge storage layer receives blue light (e.g., 400 nm to 500 nm in wavelength) and stores charge. The second light reception/charge storage layer receives green light (e.g., 500 nm to 600 nm in wavelength) and stores charge. The third light reception/charge storage layer receives red light (e.g., 600 nm to 700 nm in wavelength) and stores charge.

The solid-state imaging element according to an embodiment of the present invention can make up a single plate color solid-state imaging element such as CCD or CMOS image sensor and a single plate color solid-state imaging device. Further, the solid-state imaging element according to an embodiment of the present invention may be a front or back irradiation imaging element.

Embodiment 1

Figure 2A:
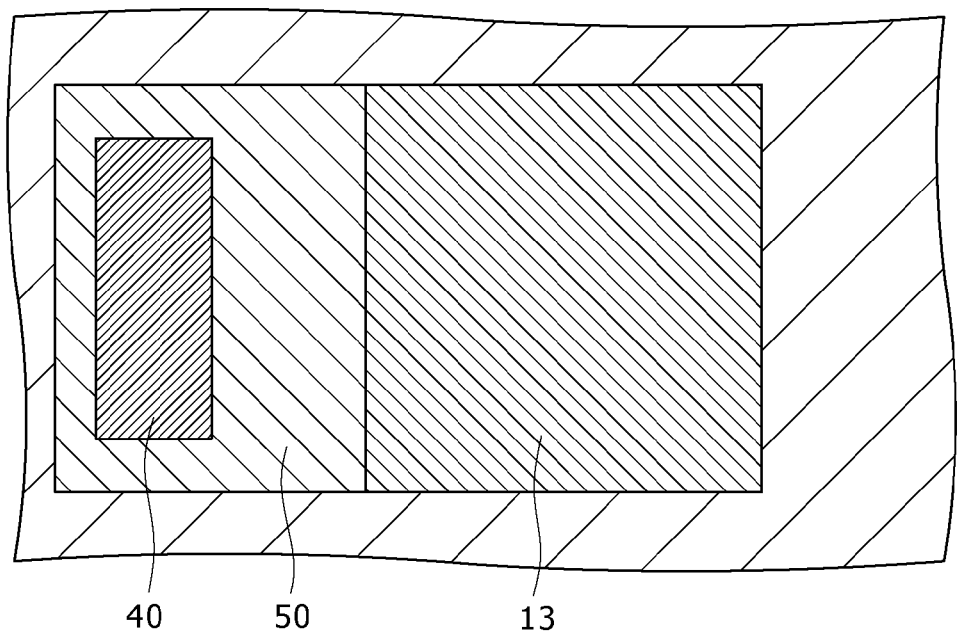
FIGS. 2A and 2B are schematic partial sectional views respectively taken along arrows A-A and B-B in FIG. 1 illustrating the arrangement of light reception/charge storage layers and other components.
Figure 2B:
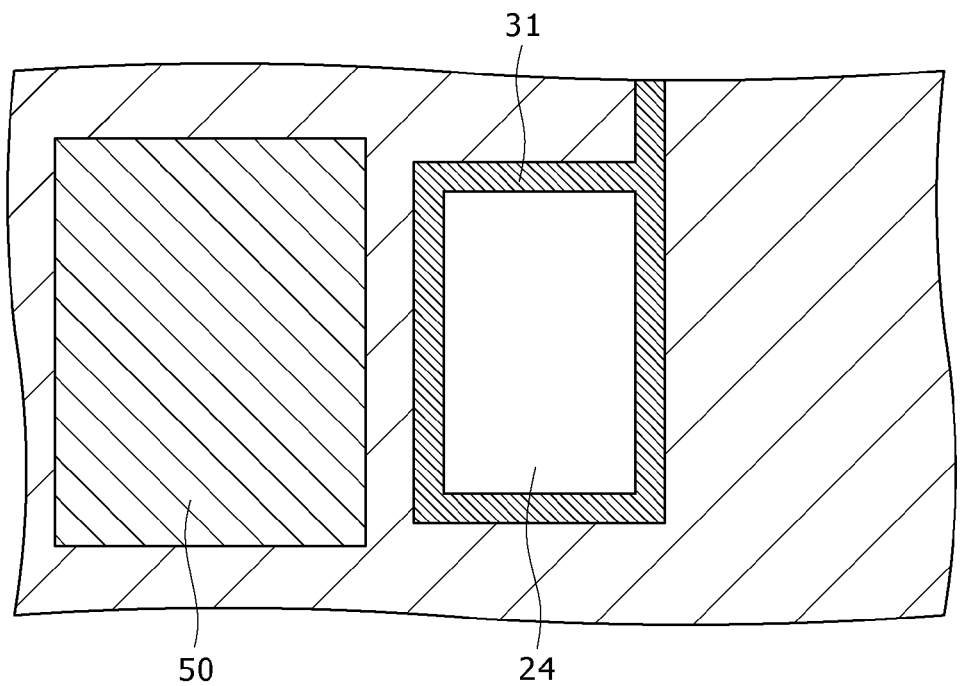

Embodiment 1 relates to the solid-state imaging element and driving method of the same according to an embodiment of the present invention. FIG. 1 is a schematic partial sectional view of the solid-state imaging element according to embodiment 1. FIGS. 2A and 2B are schematic partial sectional views respectively taken along arrows A-A and B-B in FIG. 1 illustrating the arrangement of the light reception/charge storage layers and other components.

The solid-state imaging element according to embodiment 1 or according to any one of embodiments 2 to 4 which will be described later makes up a CMOS image sensor, and front irradiation type single plate color solid-state imaging element and single plate color solid-state imaging device. The solid-state imaging element includes the following:

(A) a light reception/charge storage region 20 formed on a semiconductor layer 12 and made up of M light reception/charge storage layers 21, 22 and 23 stacked one on top of the other (where M≥2 and M=3 in the embodiment)
(B) a charge output region 40 formed on the semiconductor layer 12
(C) a conduction/non-conduction control region 50 which includes a portion of the semiconductor layer 12 located between the light reception/charge storage region 20 and charge output region 40 and
(D) a conduction/non-conduction control electrode 60 adapted to control the conduction or non-conduction state of the conduction/non-conduction control region 50.

Further, mth potential control electrodes 31 and 32 are provided between the mth light reception/charge storage layer and (m+1)th light reception/charge storage layer [where 1≤m (M−1)] to control the potentials of the light reception/charge storage layers 21, 22 and 23.

Here, the uppermost light reception/charge storage layer 21 is covered with a coating layer 13. The coating layer 13 includes a semiconductor material containing an impurity different in conductivity type from the light reception/charge storage layer 21. That is, the first light reception/charge storage layer 21 is not exposed, thus providing reduced dark current and reduced kTC noise. The coating layer 13 is connected to the conduction/non-conduction control region 50. Further, in embodiment 1 and embodiments 2 and 3 which will be described later, the potential control electrodes 31 and 32 and conduction/non-conduction control region 50 have a first conductivity type. On the other hand, the charge output region 40, light reception/charge storage layers 21, 22 and 23 and intermediate layers 24 and 25 sandwiched between the mth and (m+1)th light reception/charge storage layers have a second conductivity type. More specifically, if the first conductivity type is p type, the second conductivity type is n type. Electrons serve as carriers. The potential control electrodes 31 and 32 each include a p type impurity region. The conduction/non-conduction control region 50 includes a p type impurity region. The coating layer 13 includes a $p^+$ type impurity region. On the other hand, the light reception/charge storage layers 21, 22 and 23 and intermediate layers 24 and 25 each include an n type impurity region. The charge output region 40 includes an $n^+$ type impurity region. Further, the intermediate layers 24 and 25 are at least partially (wholly in embodiment 1 or embodiment 2 which will be described later) surrounded by the potential control electrodes 31 and 32. The potential control electrodes 31 and 32 are each a kind of embedded electrode in the form of a flat rectangular ring. The potential control electrode 31 and intermediate layer 24 form a junction FET (JFET) structure, and the potential control electrode 32 and intermediate layer 25 another junction FET (JFET) structure. The intermediate layers 24 and 25 function as channel forming regions.

It should be noted that the potential control electrode 31 surrounding the intermediate layer sandwiched between the first and second light reception/charge storage layers 21 and 22 (referred to as the first intermediate layer 24 for reasons of convenience) is referred to as the first potential control electrode 31 for reasons of convenience. Further, the potential control electrode 32 surrounding the intermediate layer sandwiched between the second and third light reception/charge storage layers 22 and 23 (referred to as the second intermediate layer 25 for reasons of convenience) is referred to as the second potential control electrode 32 for reasons of convenience.

Next, a first control voltage is applied to the first to (m−1)th potential control electrodes, and a second control voltage to the mth to (M−1)th potential control electrodes at the same time. This potentially isolates the first to mth light reception/charge storage layers from the (m+1)th to Mth light reception/charge storage layers. That is, a kind of potential barrier is formed by the application of the first control voltage to the potential control electrodes 31 and 32. It should be noted that when m=1, that is, when the charge stored in the first light reception/charge storage layer is transferred to the charge output region, the second control voltage is applied to the first to (M−1)th potential control electrodes. This potentially isolates the first light reception/charge storage layer from the second to Mth light reception/charge storage layers. On the other hand, when the charge stored in the Mth light reception/charge storage layer is transferred to the charge output region, the first control voltage is applied to the first to (M−1)th potential control electrodes. This potentially isolates the first to mth light reception/charge storage layers from the Mth ((m+1)th) light reception/charge storage layer.

In embodiment 1 or embodiments 2 to 4 which will be described later, charge is electrons. When the charge stored in the light reception/charge storage layers 21, 22 and 23 is transferred to the charge output region 40, the charge output region 40 is higher in potential than the light reception/charge storage layers 21, 22 and 23. Further, the light reception/charge storage layers 21, 22 and 23 are completely depleted before the charge is stored.

In embodiment 1 or embodiments 2 to 4 which will be described later, a conduction/non-conduction control electrode 60 is made up of a kind of MOS switch. The MOS switch includes a transfer gate formed above the conduction/non-conduction control region 50 via an insulting film 61. The semiconductor layer 12 includes a silicon layer formed by epitaxial growth on a silicon semiconductor substrate 10 of a second conductivity type (more specifically, n type). Further, the potential control electrodes 31 and 32 each include a semiconductor layer region (p type impurity region) containing a high-concentration impurity. It should be noted that reference numeral 11 denotes a p-type well region provided to control charge overflow.

The conduction/non-conduction control electrode 60, light reception/charge storage region 20 and charge output region 40 are covered with a smoothing layer 63 transparent to incident visible light. Here, the smoothing layer 63 on which visible light is incident is, for example, made of $SiO_2$ or SiN. An on-chip microlens (not shown) is provided on the smoothing layer 63. Further, a light-shielding layer 62 is formed above the region other than the light reception/charge storage region 20. The light-shielding layer 62 is, for example, made of copper (Cu) or aluminum (Al). A variety of wirings (not shown) are formed in the smoothing layer 63. Visible light incident on the smoothing layer 63 passes through opening portions provided in the light-shielding layer 62 and enters the light reception/charge storage region 20.

It should be noted that the charge output region 40 is referred to as a floating diffusion region when the solid-state imaging element makes up a CMOS image sensor. On the other hand, the charge output region 40 has a known transfer channel structure when the solid-state imaging element makes up a CCD image sensor.

A description will be given below of the driving method of a solid-state imaging element according to embodiment 1 with reference to FIG. 9. Basically, in embodiment 1, a predetermined voltage is applied to the conduction/non-conduction control electrode 60 to bring the conduction/non-conduction control region 50 into conduction. Also, a first control voltage is applied to the first to (m−1)th potential control electrodes and a second control voltage to the mth to (M−1)th potential control electrodes at the same time. This potentially isolates the first to mth light reception/charge storage layers from the (m+1)th to Mth light reception/charge storage layers, thus transferring the charge stored in the first to mth light reception/charge storage layers to the charge output region 40 via the conduction/non-conduction control region 50 which has been brought into conduction. It should be noted that a predetermined voltage should preferably be applied to the conduction/non-conduction control electrode 60 in a pulsed manner (such that no voltage is applied to the conduction/non-conduction control electrode 60 when unnecessary) in terms of providing reduced charge leakage from the light reception/charge storage region 20 to the conduction/non-conduction control region 50.

It should be noted that when m=1, that is, when the charge stored in the first light reception/charge storage layer is transferred to the charge output region, a predetermined voltage is applied to the conduction/non-conduction control electrode 60 to bring the conduction/non-conduction control region 50 into conduction. Also, a second control voltage is applied to the first to (M−1)th potential control electrodes. This potentially isolates the first light reception/charge storage layer from the second to Mth light reception/charge storage layers, thus transferring the charge stored in the first light reception/charge storage layer to the charge output region 40 via the conduction/non-conduction control region 50 which has been brought into conduction. On the other hand, when the charge stored in the Mth light reception/charge storage layer is transferred to the charge output region, a predetermined voltage is applied to the conduction/non-conduction control electrode 60 to bring the conduction/non-conduction control region 50 into conduction. Also, a first voltage is applied to the first to (M−1)th potential control electrodes. This makes the first to Mth light reception/charge storage layers potentially continuous, thus transferring the charge stored in the first to Mth light reception/charge storage layers to the charge output region 40 via the conduction/non-conduction control region 50 which has been brought into conduction.

Here, in FIG. 9, the term "B readout" refers to the transfer of the charge stored in the first light reception/charge storage layer 21 to the charge output region 40, and the term "G readout" the transfer of the charge stored in the first and second light reception/charge storage layers 21 and 22 to the charge output region 40, and the term "R readout" the transfer of the charge stored in the first, second and third light reception/charge storage layers 21, 22 and 23 to the charge output region 40.

[Step 100]

In the driving method of a solid-state imaging element according to embodiment 1, the light reception/charge storage layers 21, 22 and 23 are brought into complete depletion before the charge is stored. More specifically, in the previous operation, the charge stored in the light reception/charge storage layers 21, 22 and 23 is transferred to the charge output region 40. The light reception/charge storage layers 21, 22 and 23 are completely depleted at the completion of this operation. Therefore, such an operation allows for the light reception/charge storage layers 21, 22 and 23 to be completely depleted.

[Step 110]

Then, $V_{dd}$ (e.g., 3 V) is applied to the charge output region 40. At the same time, 0 V is applied to the conduction/non-conduction control electrode 60, and first and second potential control electrodes 31 and 32. This applies a so-called reverse bias to the light reception/charge storage layers 21, 22 and 23. The light reception/charge storage layers 21, 22 and 23 store charge (electrons in embodiment 1) dependently on the amounts of light received by the respective layers.

[Step 120]

In a predetermined exposure time, $V_{FD\text{-}reset}=V_{dd}$ is, for example, applied to the charge output region 40. At the same time, 0 V is applied to the conduction/non-conduction control electrode 60. This initializes (resets) the charge output region 40.

[Step 130]

Then, the charge stored in the first light reception/charge storage layer 21 is transferred to the charge output region 40 (B readout). More specifically, the charge output region 40 is brought into a floating state. Also, $V_{TG}=V_{dd}$ is, for example, applied to the conduction/non-conduction control electrode 60, and a second control voltage $V_{PC\text{-}2}$ (=0 V) to the first and second potential control electrodes 31 and 32. This brings the conduction/non-conduction control region 50 into conduction. Moreover, the first light reception/charge storage layer 21 is potentially isolated from the second and third light reception/charge storage layers 22 and 23. As described above, the charge stored in the first light reception/charge storage layer 21 can be transferred to the charge output region 40 via the coating layer 13 and the conduction/non-conduction control region 50 which has been brought into conduction. On the other hand, the charge stored in the second and third light reception/charge storage layers 22 and 23 is not transferred to the charge output region 40. Next, the charge output region 40 converts the charge into a voltage which will be transmitted to an known signal detection circuit which is not shown.

[Step 140]

Next, step 120 is performed again to initialize (reset) the charge output region 40. Then, the charge stored in the second light reception/charge storage layer 22 is transferred to the charge output region 40 (G readout). More specifically, the charge output region 40 is brought into a floating state. Also, $V_{TG}=V_{dd}$ is, for example, applied to the conduction/non-conduction control electrode 60, a first control voltage $V_{PC\text{-}1}$ (>0 V) to the first potential control electrode 31, and the second control voltage $V_{PC\text{-}2}$ to the second potential control electrode 32. This brings the conduction/non-conduction control region 50 into conduction. Moreover, the first and second light reception/charge storage layers 21 and 22 are potentially isolated from the third light reception/charge storage layer 23. As described above, the charge stored in the first and second light reception/charge storage layers 21 and 22 can be transferred to the charge output region 40 via the coating layer 13 and the conduction/non-conduction control region 50 which has been brought into conduction. On the other hand, the charge stored in the third light reception/charge storage layer 23 is not transferred to the charge output region 40. Next, the charge output region 40 converts the charge into a voltage which will be transmitted to a known signal detection circuit which is not shown. It should be noted that part of the charge stored in the second light reception/charge storage layer 22 reaches the coating layer 13 via the intermediate layer 24 and first light reception/charge storage layer 21 and that the remaining charge reaches the coating layer 13 via the semiconductor layer 12 outside the first potential control electrode 31.

[Step 150]

Next, step 120 is performed again to initialize (reset) the charge output region 40. Then, the charge stored in the third light reception/charge storage layer 23 is transferred to the charge output region 40 (R readout). More specifically, the charge output region 40 is brought into a floating state. Also, $V_{TG}=V_{dd}$ is, for example, applied to the conduction/non-conduction control electrode 60, and the first control voltage $V_{PC-1}$ to the first and second potential control electrode 31 and 32. This brings the conduction/non-conduction control region 50 into conduction. As described above, the charge stored in the first, second and third light reception/charge storage layers 21, 22 and 23 can be transferred to the charge output region 40 via the conduction/non-conduction control region 50 which has been brought into conduction. Next, the charge output region 40 converts the charge into a voltage which will be transmitted to a known signal detection circuit which is not shown. It should be noted that part of the charge stored in the third light reception/charge storage layer 23 reaches the coating layer 13 via the intermediate layer 25, second light reception/charge storage layer 22, intermediate layer 24 and first light reception/charge storage layer 21, that part thereof reaches the coating layer 13 via the intermediate layer 25, second light reception/charge storage layer 22, and semiconductor layer 12 outside the first potential control electrode 31, and that the remaining charge reaches the coating layer 13 via the semiconductor layer 12 outside the second potential control electrode 32.

In embodiment 1, step 130 transfers the charge stored in the first light reception/charge storage layer 21 to the charge output region 40. The charge stored in the first light reception/charge storage layer 21 has been generated as a result of reception of blue light. Further, step 140 transfers the charge stored in the second light reception/charge storage layer 22 to the charge output region 40. The charge stored in the second light reception/charge storage layer 22 has been generated as a result of reception of green light. Still further, step 150 transfers the charge stored in the third light reception/charge storage layer 23 to the charge output region 40. The charge stored in the third light reception/charge storage layer 23 has been generated as a result of reception of red light. Therefore, the amounts of blue, green and red light can be obtained by the calculations performed by a known signal detection circuit which is not shown based on the voltages converted from the charge by the charge output region 40. The same is true for embodiments 2 to 4 which will be described later. It should be noted that if no mechanical shutter mechanism is provided, the light reception/charge storage layers receive light in steps 130, 140 and 150. However, this does not present any particular problem because the time periods of steps 130, 140 and 150 are extremely short.

In the solid-state imaging element or driving method of a solid-state imaging element according to embodiment 1, the mth potential control electrodes are provided between the mth and (m+1)th light reception/charge storage layers to control the potentials of the light reception/charge storage layers. This transfers the charge stored in the light reception/charge storage layers to the charge output region via the conduction/non-conduction control region which has been brought into conduction if the appropriate control voltages are applied to the potential control electrodes, thus downsizing the solid-state imaging element as a whole.

The solid-state imaging element according to embodiment 1 can be manufactured based, for example, on the following method. That is, the p type well region 11 and semiconductor layer 12 are formed on the silicon semiconductor substrate 10 by epitaxial growth (epitaxial growth using in-situ doping) first. Next, the light reception/charge storage layers 21, 22 and 23, intermediate layers 24 and 25, potential control electrodes 31 and 32 and conduction/non-conduction control region 50 are formed based on a known ion injection technique. Next, the insulting film 61 is formed on the surface of the semiconductor layer 12, followed by the formation of the conduction/non-conduction control electrode 60 above the conduction/non-conduction control region 50. Further, the charge output region 40 and coating layer 13 are formed. Finally, the smoothing layer 63, light-shielding layer 62 and smoothing layer 63 are formed over the entire surface.

Alternatively, the solid-state imaging element according to embodiment 1 can be manufactured in the manner which will be described with reference to the schematic partial sectional views of a silicon semiconductor substrate and other components shown in FIGS. 10A to 10D and FIGS. 11A and 11B. It should be noted that FIGS. 10A to 10D and FIGS. 11A and 11B are schematic partial sectional views similar to that of FIG. 1.

[Step A]

First, the p type well region 11 is formed on the silicon semiconductor substrate 10 by an ion injection technique, followed by the formation of a semiconductor layer 12A containing an n type impurity by epitaxial growth (refer to FIG. 10A). Next, the second potential control electrodes 32 are formed in the semiconductor layer 12A based on a known ion injection technique (refer to FIG. 10B). It should be noted that the semiconductor layer 12A corresponds to the third light reception/charge storage layer 23 and intermediate layer 25.

[Step B]

Next, a semiconductor layer 12B containing an n type impurity is formed over the entire surface by epitaxial growth (refer to FIG. 10C). Next, the first potential control electrodes 31 are formed in the surface region of the semiconductor layer 12B (refer to FIG. 10D). It should be noted that the semiconductor layer 12B corresponds to the second light reception/charge storage layer 22 and intermediate layer 24.

[Step C]

Next, a semiconductor layer 12C containing an n type impurity is formed over the entire surface by epitaxial growth, followed by the formation of the insulting film 61 made of $SiO_2$ (refer to FIG. 11A). The insulting film 61 is formed by oxidizing the surface of the semiconductor layer 12C. Then, the conduction/non-conduction control region 50 is formed in the semiconductor layer 12C based on a known ion injection technique (refer to FIG. 11B). It should be noted that the semiconductor layer 12C corresponds to the first light reception/charge storage layer 21.

[Step D]

Then, the conduction/non-conduction control electrode 60 is formed above the conduction/non-conduction control region 50 by a known method. Next, the charge output region 40 and coating layer 13 are formed in the semiconductor layer 12C based on a known ion injection technique. Finally, the smoothing layer 63 and light-shielding layer 62 are formed, thus providing the solid-state imaging element according to embodiment 1. It should be noted that the solid-state imaging elements according to embodiment 2 and 3 can be basically manufactured as described above.

Embodiment 2

Figure 3:
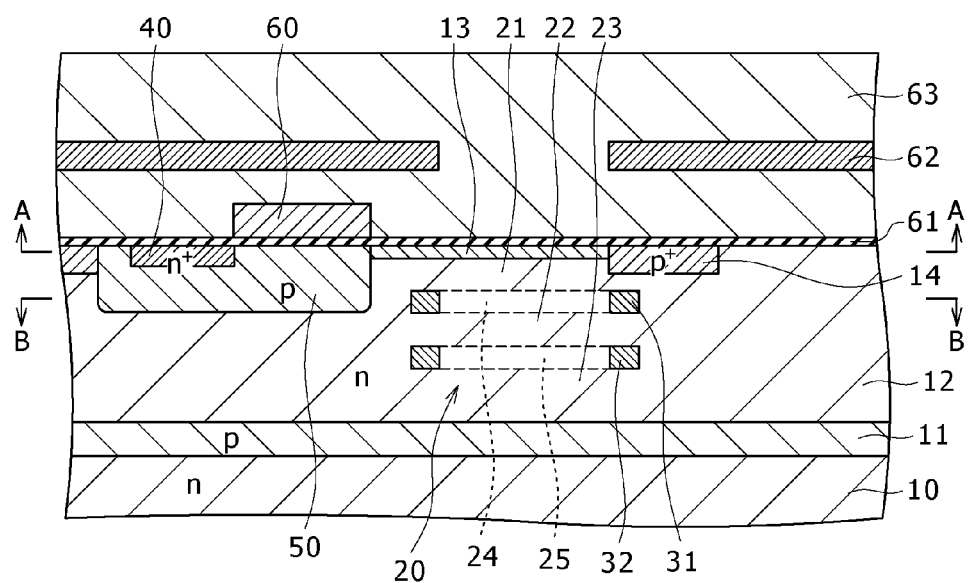
FIG. 3 is a schematic partial sectional view of the solid-state imaging element according to embodiment 2.
Figure 4A:
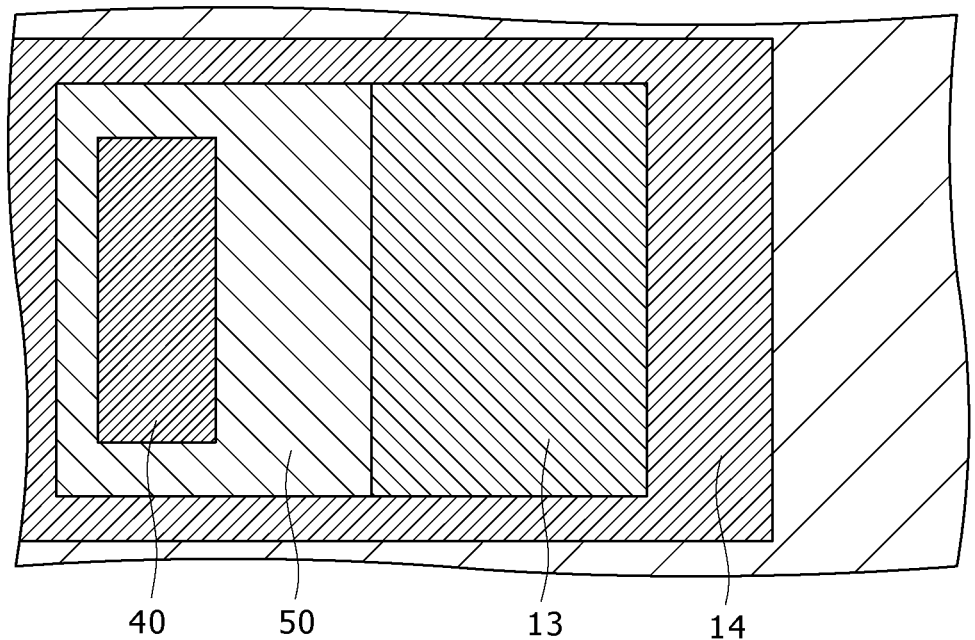
FIGS. 4A and 4B are schematic partial sectional views respectively taken along arrows A-A and B-B in FIG. 3 illustrating the arrangement of the light reception/charge storage layers and other components.
Figure 4B:
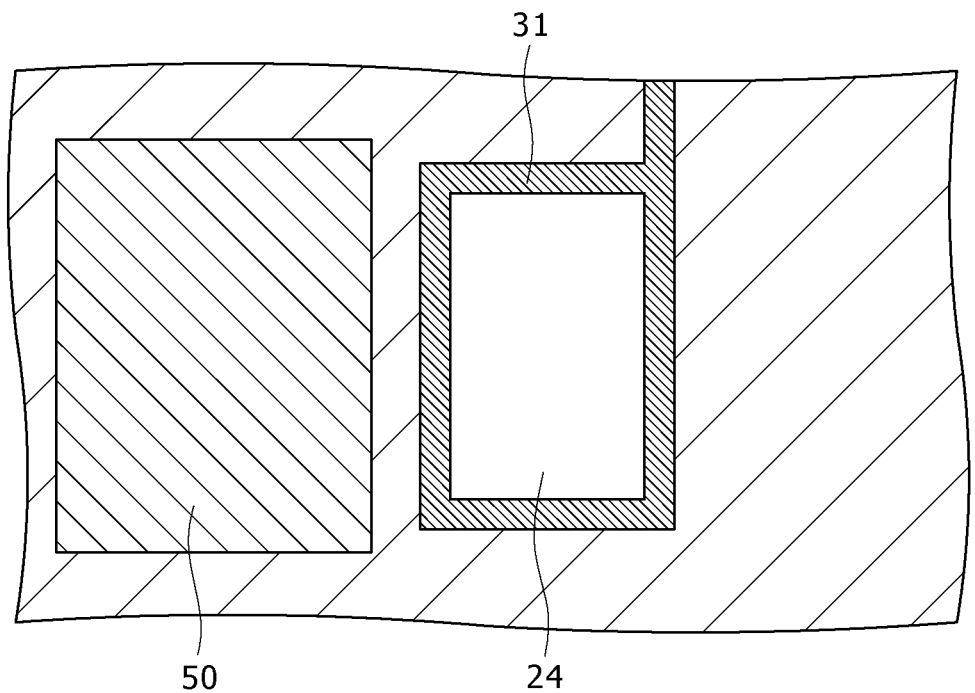

Embodiment 2 is a modification of embodiment 1. FIG. 3 illustrates a schematic partial sectional view of the solid-state imaging element according to embodiment 2. FIGS. 4A and 4B illustrate schematic partial sectional views respectively taken along arrows A-A and B-B in FIG. 3 illustrating the arrangement of the light reception/charge storage layers and other components.

In the solid-state imaging element according to embodiment 2, an element isolation region 14 is formed on the surface of the semiconductor layer 12. The element isolation region 14 is made of a semiconductor material containing an impurity different in conductivity type from the light reception/charge storage layers 21, 22 and 23. It should be noted that because the light reception/charge storage layers 21, 22 and 23 are n type impurity regions, the element isolation region 14 is a p$^+$ type impurity region. More specifically, the element isolation region 14 surrounds the light reception/charge storage region 20, conduction/non-conduction control region 50 and coating layer 13.

Except for the above, the solid-state imaging element according to embodiment 2 can be identical in configuration and structure to that according to embodiment 1. Therefore, a detailed description thereof will be omitted.

Embodiment 3

Figure 5:
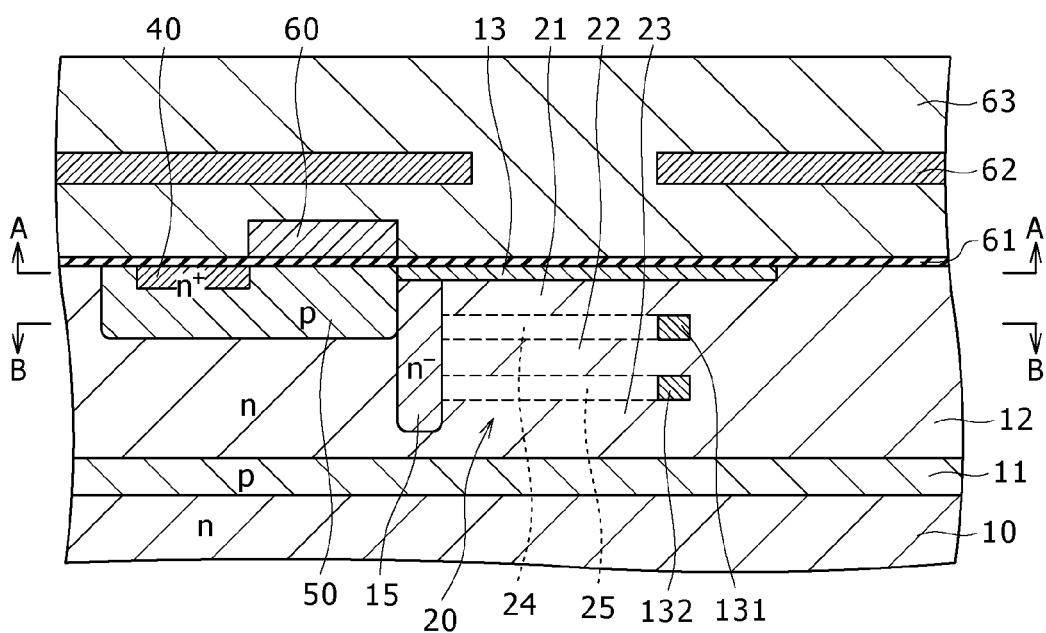
FIG. 5 is a schematic partial sectional view of the solid-state imaging element according to embodiment 3.
Figure 6A:
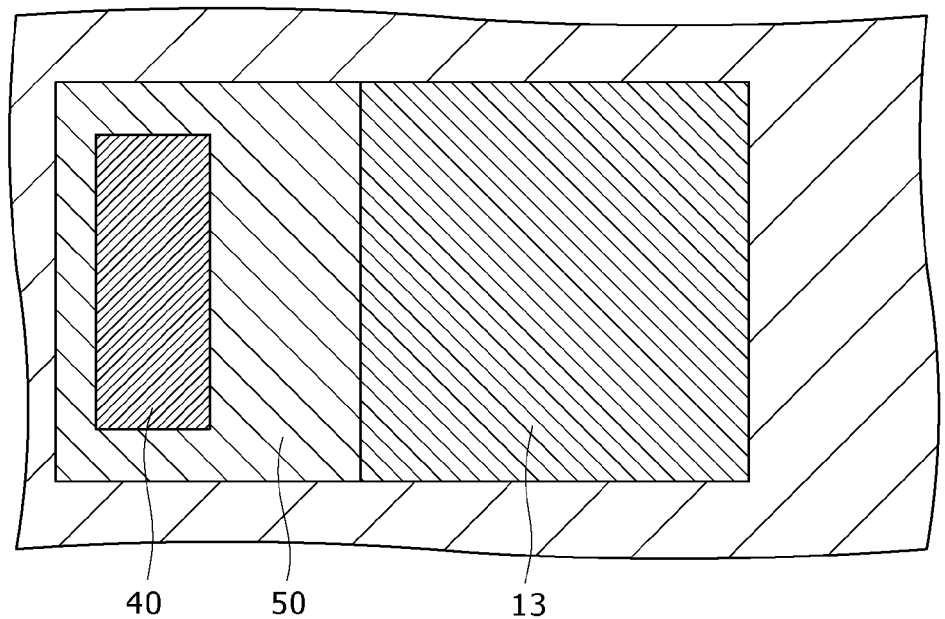
FIGS. 6A and 6B are schematic partial sectional views respectively taken along arrows A-A and B-B in FIG. 5 illustrating the arrangement of the light reception/charge storage layers and other components.
Figure 6B:
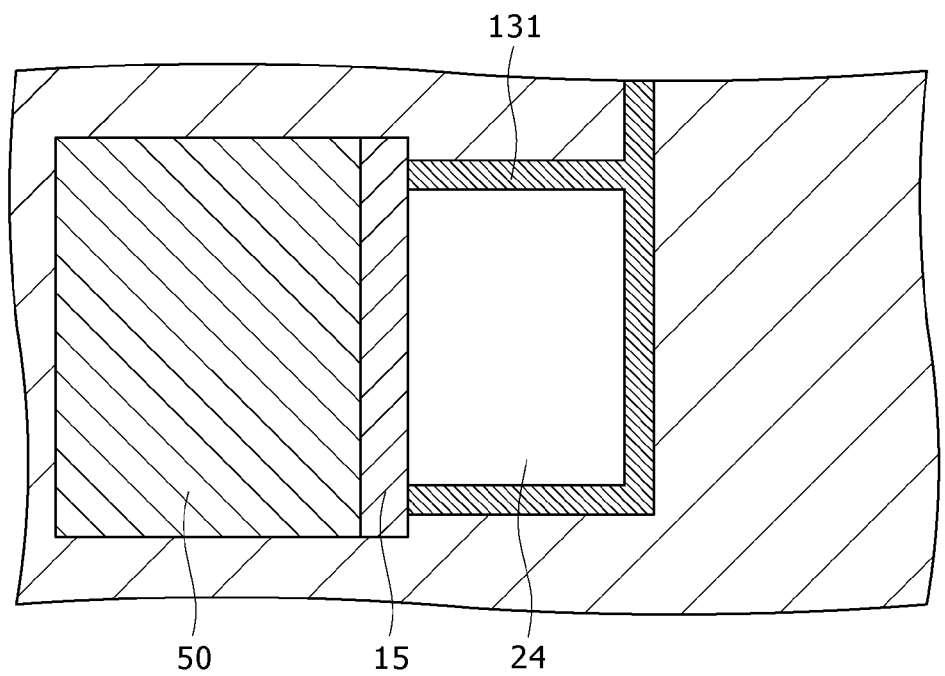

Embodiment 3 is also a modification of embodiment 1. FIG. 5 illustrates a schematic partial sectional view of the solid-state imaging element according to embodiment 3. FIGS. 6A and 6B illustrate schematic partial sectional views respectively taken along arrows A-A and B-B in FIG. 5 illustrating the arrangement of the light reception/charge storage layers and other components.

In the solid-state imaging element according to embodiment 3, a potential barrier region 15 is formed in the region of the semiconductor layer 12 between the light reception/charge storage layers 21, 22 and 23 and the conduction/non-conduction control region 50. The potential barrier region 15 contains an impurity identical in conductivity type to the light reception/charge storage layers 21, 22 and 23. More specifically, because the light reception/charge storage layers 21, 22 and 23 are n type impurity regions, the potential barrier region 15 is an n$^-$ type impurity region. The intermediate layers 24 and 25 are partially surrounded by potential control electrodes 131 and 132. The potential control electrodes 131 and 132 are substantially not provided between the potential barrier region 15 and the intermediate layers 24 and 25. The potential control electrodes 131 and 132 surrounding the intermediate layers 24 and 25 are approximately U-shaped in plan view. As described above, by providing the potential barrier region 15, it is possible to transfer the charge stored in the light reception/charge storage layers 21, 22 and 23 to the charge output region 40 via the coating layer 13 and the conduction/non-conduction control region 50 which has been brought into conduction in a reliable manner.

Except for the above, the solid-state imaging element according to embodiment 3 can be identical in configuration and structure to that according to embodiment 1. Therefore, a detailed description thereof will be omitted. It should be noted that the element isolation region 14 may be provided in the solid-state imaging element according to embodiment 3 as for that according to embodiment 2.

Embodiment 4

Figure 8A:
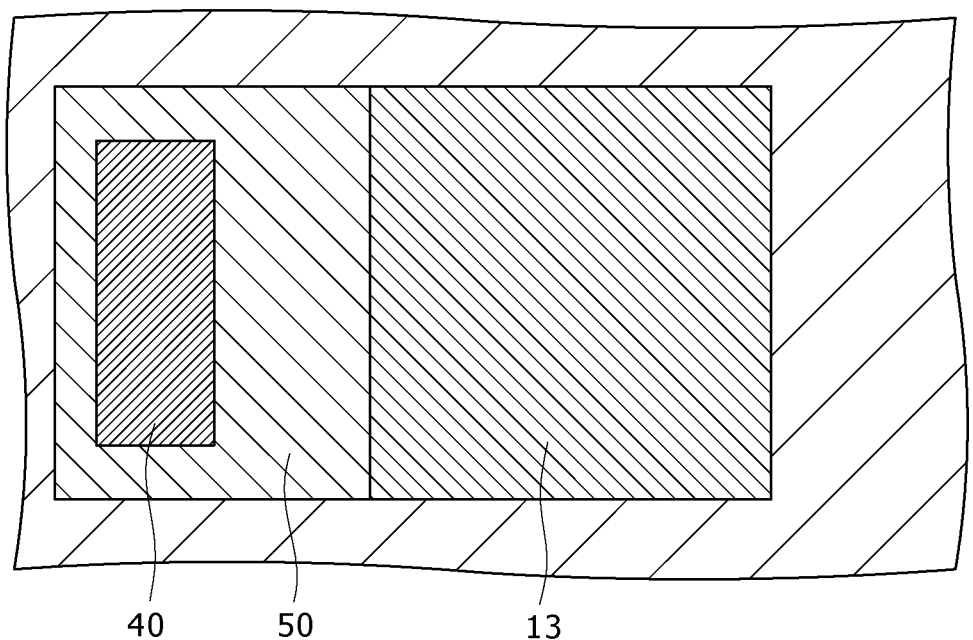
FIGS. 8A and 8B are schematic partial sectional views respectively taken along arrows A-A and B-B in FIG. 7 illustrating the arrangement of the light reception/charge storage layers and other components.
Figure 8B:
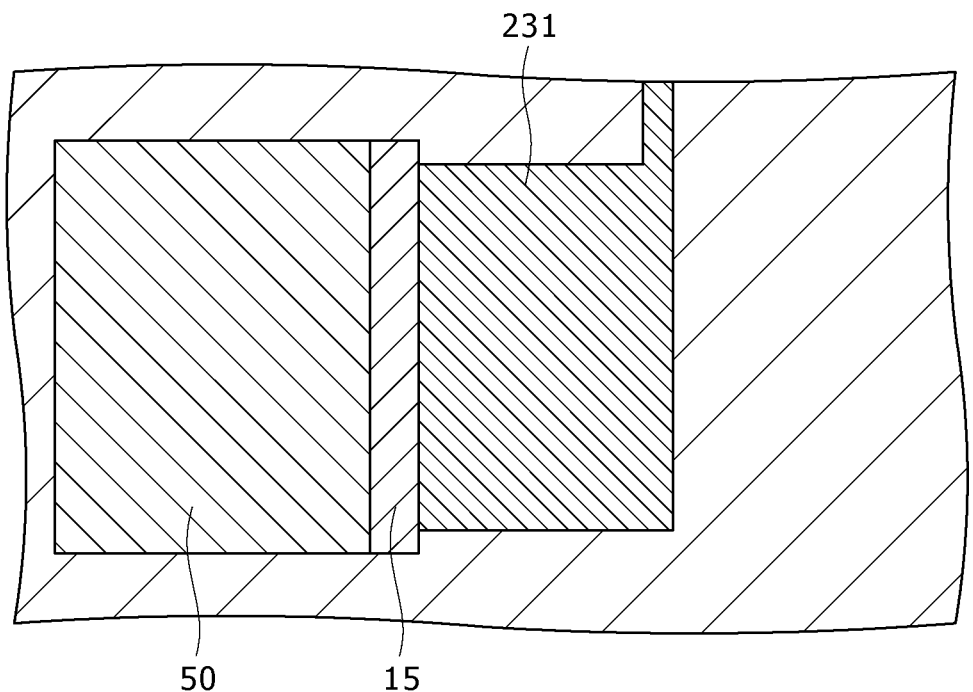

Embodiment 4 is also a modification of embodiment 1. FIG. 7 illustrates a schematic partial sectional view of the solid-state imaging element according to embodiment 4. FIGS. 8A and 8B illustrate schematic partial sectional views respectively taken along arrows A-A and B-B in FIG. 7 illustrating the arrangement of the light reception/charge storage layers and other components.

In the solid-state imaging element according to embodiment 4, the potential barrier region 15 is formed in the region of the semiconductor layer 12 between the light reception/charge storage layers 21, 22 and 23 and the conduction/non-conduction control region 50 as in the solid-state imaging element according to embodiment 3. The potential barrier region 15 contains an impurity identical in conductivity type to the light reception/charge storage layers 21, 22 and 23. More specifically, because the light reception/charge storage layers 21, 22 and 23 are n type impurity regions, the potential barrier region 15 is an n$^-$ type impurity region. In embodiment 4, potential control electrodes 231 and 232 and the conduction/non-conduction control region 50 also have the first conductivity type (more specifically, p type). On the other hand, the charge output region 40 and light reception/charge storage layers 21, 22 and 23 also have the second conductivity type (more specifically, n type).

Unlike in embodiment 3, the intermediate layers 24 and 25 are not provided, and the potential control electrodes are sandwiched between the mth and (m+1)th light reception/charge storage layers in embodiment 4. More specifically, the potential control electrode 231 is sandwiched between the first and second light reception/charge storage layers 21 and 22. Further, the potential control electrode 232 is sandwiched between the second and third light reception/charge storage layers 22 and 23. Each of the potential control electrodes 231 and 232 may be in a single-layered form. Alternatively, these electrodes may be in a meshed form.

Except for the above, the solid-state imaging element according to embodiment 4 can be identical in configuration and structure to that according to embodiment 1 or 3. Therefore, a detailed description thereof will be omitted. It should be noted that the element isolation region 14 may be provided in the solid-state imaging element according to embodiment 4 as for that according to embodiment 2.

A description will be given below of the driving method of the solid-state imaging element according to embodiment 4.
[Step 400]

In the driving method of the solid-state imaging element according to embodiment 4, the light reception/charge storage layers 21, 22 and 23 are also completely depleted first before the charge is stored as is done in step 100 of embodiment 1.
[Step 410]

Then, the light reception/charge storage layers 21, 22 and 23 store charge dependently on the amounts of light received by the respective layers as is done in step 110 of embodiment 1.
[Step 420]

In a predetermined exposure time, the charge output region 40 is initialized (reset) as is done in step 120 of embodiment 1.
[Step 430]

Then, the charge stored in the first light reception/charge storage layer 21 is transferred to the charge output region 40. More specifically, the charge output region 40 is brought into a floating state. Also, $V_{TG}=V_{dd}$ is, for example, applied to the conduction/non-conduction control electrode 60, and a second control voltage $V'_{PC-2}$ (>0 V) to the first and second potential control electrodes 231 and 232. This brings the conduction/non-conduction control region 50 into conduction. Moreover, the first light reception/charge storage layer 21 is potentially isolated from the second and third light reception/charge storage layers 22 and 23. The potentials of the regions are as listed below.

[A₁] Charge output region 40<Conduction/non-conduction control region 50<Portion of the potential barrier region 15 located at the same level as the first light reception/charge storage layer 21<First light reception/charge storage layer 21

[B₁] Portion of the potential barrier region 15 located at the same level as the second light reception/charge storage layer 22>Second light reception/charge storage layer 22

[C₁] Portion of the potential barrier region 15 located at the same level as the third light reception/charge storage layer 23>Third light reception/charge storage layer 23

As a result, the charge stored in the first light reception/charge storage layer 21 can be transferred to the charge output region 40 via the potential barrier region 15 and the conduction/non-conduction control region 50 which has been brought into conduction. On the other hand, the charge stored in the second and third light reception/charge storage layers 22 and 23 is not transferred to the charge output region 40. Next, the charge output region 40 converts the charge into a voltage which will be transmitted to a known signal detection circuit which is not shown.

[Step 440]

Next, step 420 is performed again to initialize (reset) the charge output region 40. Then, the charge stored in the second light reception/charge storage layer 22 is transferred to the charge output region 40. More specifically, the charge output region 40 is brought into a floating state. Also, $V_{TG}=V_{dd}$ is, for example, applied to the conduction/non-conduction control electrode 60, a first control voltage $V'_{PC-1}$ (=0 V) to the first potential control electrode 231, and the second control voltage $V'_{PC-2}$ to the second potential control electrode 232. This brings the conduction/non-conduction control region 50 into conduction. Moreover, the first and second light reception/charge storage layers 21 and 22 are potentially isolated from the third light reception/charge storage layer 23. On the other hand, the second light reception/charge storage layer 22 is raised to a higher potential than the second light reception/charge storage layer 22 in step 430. The potentials of the regions are as listed below.

[A₂] Charge output region 40<Conduction/non-conduction control region 50<Portion of the potential barrier region 15 located at the same level as the second light reception/charge storage layer 22 and portion of the potential barrier region 15 located more toward the insulting film 61<Second light reception/charge storage layer 22

[B₂] Portion of the potential barrier region 15 located at the same level as the third light reception/charge storage layer 23 and portion of the potential barrier region 15 located more toward the p type well region>Third light reception/charge storage layer 23

As a result, the charge stored in the second light reception/charge storage layer 22 can be transferred to the charge output region 40 via the potential barrier region 15 and the conduction/non-conduction control region 50 which has been brought into conduction. On the other hand, the charge stored in the third light reception/charge storage layer 23 is not transferred to the charge output region 40. Next, the charge output region 40 converts the charge into a voltage which will be transmitted to a known signal detection circuit which is not shown.

[Step 450]

Next, step 420 is performed again to initialize (reset) the charge output region 40. Then, the charge stored in the third light reception/charge storage layer 23 is transferred to the charge output region 40 (R readout). More specifically, the charge output region 40 is brought into a floating state. Also, $V_{TG}=V_{dd}$ is, for example, applied to the conduction/non-conduction control electrode 60, and the first control voltage $V'_{PC-1}$ to the first and second potential control electrodes 231 and 232. This brings the conduction/non-conduction control region 50 into conduction. Moreover, the third light reception/charge storage layer 23 is raised to a higher potential than the third light reception/charge storage layer 23 in step 440. The potentials of the regions are as listed below.

[A₃] Charge output region 40<Conduction/non-conduction control region 50<Portion of the potential barrier region 15 located at the same level as the third light reception/charge storage layer 23 and portion of the potential barrier region 15 located more toward the insulting film 61<Third light reception/charge storage layer 23

As a result, the charge stored in the third light reception/charge storage layer 23 can be transferred to the charge output region 40 via the potential barrier region 15 and the conduction/non-conduction control region 50 which has been brought into conduction. Next, the charge output region 40 converts the charge into a voltage which will be transmitted to a known signal detection circuit which is not shown.

Although preferred embodiments of the present invention have been described above, the present invention is not limited to the aforementioned embodiments. The configurations and structures of the solid-state imaging element described in the embodiments are merely illustrative and may be modified as appropriate. The value M is not limited to 3 but may be 2. Alternatively, this value may be 4 or greater. In the embodiments, on the other hand, the light reception/charge storage layers 21, 22 and 23 are completely depleted. However, the term "complete depletion" also includes a state in which these layers are almost completely depleted or in which they are not completely depleted.

Figure 12:
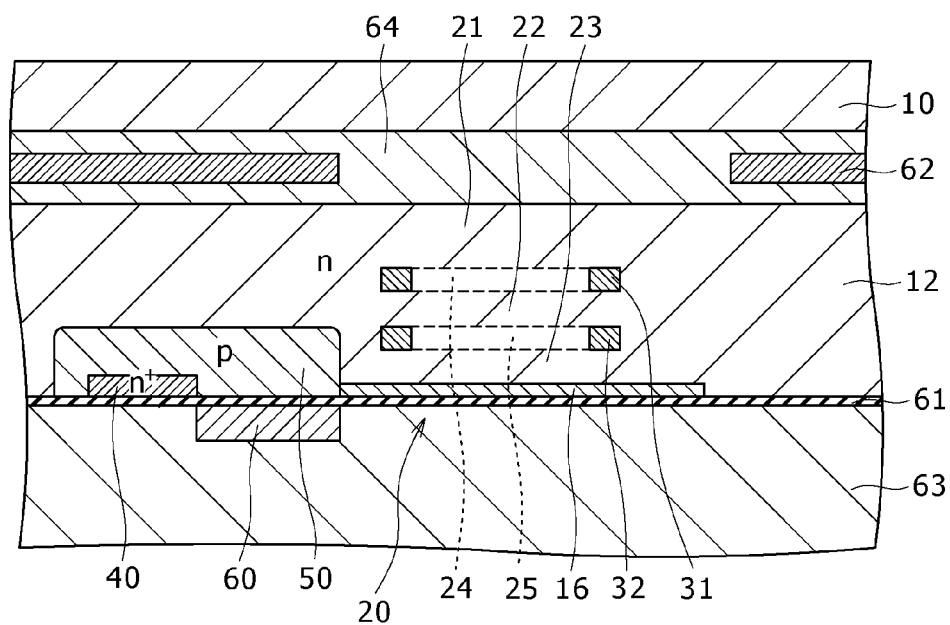
FIG. 12 is a schematic partial sectional view of the solid-state imaging element according to embodiment 1 when the imaging element is a back irradiation imaging element.
Figure 13:
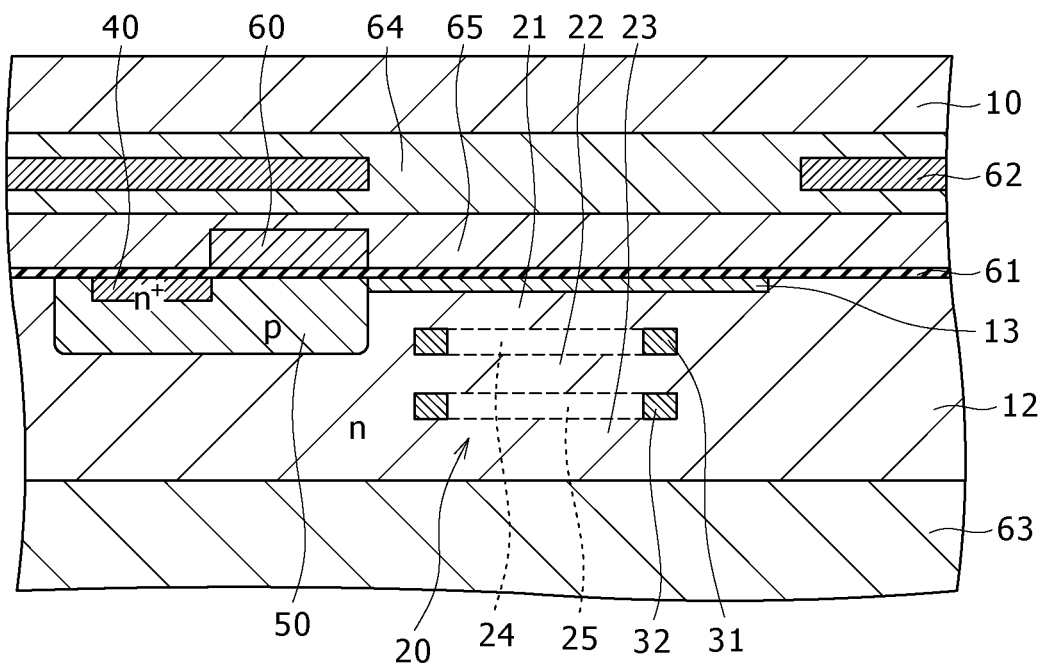
FIG. 13 is a schematic partial sectional view of a modification example of the back irradiation solid-state imaging element according to embodiment 1 when the imaging element is a back irradiation imaging element.

Although, in the embodiments, only the front irradiation type solid-state imaging elements were described. However, the imaging element may be a back irradiation imaging element. More specifically, if the solid-state imaging element described in embodiment 1 is a back irradiation imaging element, light is caused to enter the imaging element from the silicon semiconductor substrate 10 as illustrated in FIG. 12. An insulating layer 64, the light-shielding layer 62 and semiconductor layer 12 are formed in the silicon semiconductor substrate 10. Further, the light reception/charge storage layers 21, 22 and 23, charge output region (floating diffusion region) 40 and conduction/non-conduction control region 50 are formed in the semiconductor layer 12. Still further, the insulting film 61 is formed on the surface of the semiconductor layer 12, and the conduction/non-conduction control electrode 60 below the conduction/non-conduction control region 50. Still further, the smoothing layer 63 is formed under the conduction/non-conduction control electrode 60. The conduction/non-conduction control electrode 60 is provided more downward than the third light reception/charge storage layer 23. Alternatively, the conduction/non-conduction control electrode 60 may be provided more upward than the first light reception/charge storage layer 21 as illustrated in FIG. 13. It should be noted that reference numeral 65 denotes an insulating layer, and reference numeral 16 a conductive layer in FIG. 13.

The present application contains subject matter related to that disclosed in Japanese Priority Patent Application JP 2009-039765 filed in the Japan Patent Office on Feb. 23, 2009, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. A solid-state imaging element comprising:
(A) a light reception/charge storage region in a semiconductor layer, the light reception/charge storage region including (i) M light reception/charge storage layers stacked one on top of the other, where M≥2, and (ii) m potential control electrodes to control the potentials of the light reception/charge storage layers, where 1≤m≤ (M−1);
(B) a charge output region in the semiconductor layer;
(C) a conduction/non-conduction control region which includes a portion of the semiconductor layer located between the light reception/charge storage region and the charge output region;
(D) a conduction/non-conduction control electrode adapted to control the conduction or non-conduction state of the conduction/non-conduction control region;
(E) an insulating film between the conduction/non-conduction control region and the conduction/non-conduction control electrode; and
(F) a coating layer between the insulating film and a surface of one of the M light reception/charge storage layers, the coating layer being connected to the conduction/non-conduction control region, the coating layer including a semiconductor material containing an impurity different in conductivity type from at least one of light reception/ charge storage layers,
wherein,
mth potential control electrodes are provided between the mth and (m+1)th light reception/charge storage layer to control the potentials of the light reception/charge storage layers, mth being an ordinal number.

2. The solid-state imaging element of claim 1, wherein:
a first control voltage is applied to the first to (m−1)th potential control electrodes, and
a second control voltage to the mth to (M−1)th potential control electrodes at the same time so as to potentially isolate the first to mth light reception/charge storage layers from the (m+1)th to Mth light reception/charge storage layers.

3. The solid-state imaging element of claim 1, wherein:
the potential control electrodes and conduction/non-conduction control region have a first conductivity type, and
the charge output region, light reception/charge storage layers and intermediate layers sandwiched between the mth and (m+1)th light reception/charge storage layers have a second conductivity type.

4. The solid-state imaging element of claim 3, wherein the intermediate layers are at least partially surrounded by the potential control electrodes.

5. The solid-state imaging element of claim 1, wherein an uppermost light reception/charge storage layer is covered with the coating layer, the coating layer comprising a semiconductor material containing an impurity different in conductivity type from the uppermost light reception/charge storage layer.

6. The solid-state imaging element of claim 1, wherein a potential barrier region is formed in the region of the semiconductor layer between the light reception/charge storage layers and conduction/non-conduction control region, the potential barrier region containing an impurity of the same conductivity type as for the light reception/charge storage layers.

7. The solid-state imaging element of claim 6, wherein:
the potential control electrodes and conduction/non-conduction control region have a first conductivity type,
the charge output region, light reception/charge storage layers and intermediate layers sandwiched between the mth and (m+1)th light reception/charge storage layers have a second conductivity type, and
the intermediate layers are at least partially surrounded by the potential control electrodes.

8. The solid-state imaging element of claim 6, wherein:
the potential control electrodes and conduction/non-conduction control region have a first conductivity type,
the charge output region and light reception/charge storage layers have a second conductivity type, and
the potential control electrodes are sandwiched between the mth and (m+1)th light reception/charge storage layers.

9. The solid-state imaging element of claim 1, wherein an element isolation region is formed on the surface of the semiconductor layer, the element isolation layer comprising a semiconductor material containing an impurity different in conductivity type from the light reception/charge storage layers.

10. The solid-state imaging element of claim 1, wherein the light reception/charge storage layers are completely depleted before the charge is stored.

11. A driving method of a solid-state imaging element, the solidstate imaging element including
(A) a light reception/charge storage region in a semiconductor layer, the light reception/charge storage region including (i) M light reception/charge storage layers stacked one on top of the other, where M≥2, and (ii) m potential control electrodes to control the potentials of the light reception/charge storage layers, where 1≤m≤ (M−1);
(B) a charge output region in the semiconductor layer;
(C) a conduction/non-conduction control region which includes a portion of the semiconductor layer located between the light reception/charge storage region and the charge output region;
(D) a conduction/non-conduction control electrode adapted to control the conduction or non-conduction state of the conduction/non-conduction control region;
(E) an insulating film between the conduction/non-conduction control region and the conduction/non-conduction control electrode; and
(F) a coating layer between the insulating film and a surface of one of the M light reception/charge storage layers, the coating layer being connected to the conduction/non-conduction control region, the coating layer including a semiconductor material containing an impurity different in conductivity type from at least one of light reception/ charge storage layers, wherein mth potential control electrodes are provided between the mth and (m+1)th light reception/charge storage layers to control the potentials of the light reception/charge storage layers, mth being an ordinal number, the driving method comprising the steps of:
applying a predetermined voltage to the conduction/non-conduction control electrode to bring the conduction/non-conduction control region into conduction;
applying a first control voltage to the first to (m−1)th potential control electrodes and a second control voltage to the mth to (M−1)th potential control electrodes at the same time to potentially isolate the first to mth light reception/ charge storage layers from the (m+1)th to Mth light reception/charge storage layers; and transferring the charge stored in the first to mth light reception/charge storage layers to the charge output region via the conduction/non-conduction control region which has been brought into conduction.

12. The driving method of a solid-state imaging element of claim 11, wherein:

in the solid-state imaging element, the potential control electrodes and conduction/nonconduction control region have a first conductivity type, and the charge output region, light reception/charge storage layers and intermediate layers sandwiched between the mth and (m+1)th light reception/charge storage layers have a second conductivity type.

13. The driving method of a solid-state imaging element of claim 12, wherein in the solid-state imaging element, the intermediate layers are at least partially surrounded by the potential control electrodes.

14. The driving method of a solid-state imaging element of claim 11, wherein in the solid-state imaging element, an uppermost light reception/charge storage layer is covered with the coating layer, the coating layer comprising a semiconductor material containing an impurity different in conductivity type from the uppermost light reception/charge storage layer.

15. The driving method of a solid-state imaging element of claim 11, wherein:

in the solid-state imaging element, a potential barrier region is formed in the region of the semiconductor layer between the light reception/charge storage layers and conduction/nonconduction control region, the potential barrier region containing an impurity of the same conductivity type as for the light reception/charge storage layers.

16. The driving method of a solid-state imaging element of claim 15 wherein:

in the solid-state imaging element, the potential control electrodes and conduction/nonconduction control region have a first conductivity type, the charge output region, light reception/charge storage layers and intermediate layers sandwiched between the mth and (m+1)th light reception/charge storage layers have a second conductivity type, and the intermediate layers are at least partially surrounded by the potential control electrodes.

17. The driving method of a solid-state imaging element of claim 15 wherein:

in the solid-state imaging element, the potential control electrodes and conduction/nonconduction control region have a first conductivity type, the charge output region and light reception/charge storage layers have a second conductivity type, and the potential control electrodes are sandwiched between the mth and (m+1)th light reception/charge storage layers.

18. The driving method of a solid-state imaging element of claim 11, wherein in the solid-state imaging element, an element isolation region is formed on the surface of the semiconductor layer, the element isolation layer comprising a semiconductor material containing an impurity different in conductivity type from the light reception/charge storage layers.

19. The driving method of a solid-state imaging element of claim 11, wherein in the solid-state imaging element, the light reception/charge storage layers are completely depleted before the charge is stored.

* * * * *